(12) United States Patent
Hinterberger et al.

(10) Patent No.: US 10,942,224 B2
(45) Date of Patent: Mar. 9, 2021

(54) BATTERY CELL FOR A VEHICLE BATTERY, AND VEHICLE BATTERY AND MOTOR VEHICLE

(71) Applicant: AUDI AG, Ingolstadt (DE)

(72) Inventors: Michael Hinterberger, Großmehring (DE); Berthold Hellenthal, Schwanstetten (DE)

(73) Assignee: AUDI AG, Ingolstadt (DE)

( * ) Notice: Subject to any disclaimer, the term of this patent is extended or adjusted under 35 U.S.C. 154(b) by 78 days.

(21) Appl. No.: 16/414,054

(22) Filed: May 16, 2019

(65) Prior Publication Data

US 2019/0353714 A1 Nov. 21, 2019

(30) Foreign Application Priority Data

May 17, 2018 (DE) .......................... 102018207733.9

(51) Int. Cl.
| | |
|---|---|
| *G01R 31/396* | (2019.01) |
| *H01M 10/48* | (2006.01) |
| *H01M 10/42* | (2006.01) |
| *B60L 58/12* | (2019.01) |
| *G01R 31/3835* | (2019.01) |
| *H02J 50/80* | (2016.01) |
| *H01M 10/0525* | (2010.01) |

(52) U.S. Cl.
CPC ............ *G01R 31/396* (2019.01); *B60L 58/12* (2019.02); *G01R 31/3835* (2019.01); *H01M 10/425* (2013.01); *H01M 10/4285* (2013.01); *H01M 10/48* (2013.01); *H02J 50/80* (2016.02); *H01M 10/0525* (2013.01)

(58) Field of Classification Search
CPC ...... G01R 31/396; G01N 31/02; H01M 10/48
See application file for complete search history.

(56) References Cited

U.S. PATENT DOCUMENTS

| | | | | |
|---|---|---|---|---|
| 4,253,155 | A | * | 2/1981 | Freiday ................ G01R 35/005 324/130 |
| 8,635,916 | B1 | | 1/2014 | Loverich et al. |
| 2012/0276854 | A1 | | 11/2012 | Joshi et al. |

(Continued)

FOREIGN PATENT DOCUMENTS

| | | |
|---|---|---|
| DE | 102009048236 A1 | 4/2011 |
| DE | 102013106740 A1 | 12/2014 |
| EP | 2328207 A1 | 6/2011 |

OTHER PUBLICATIONS

Examination Report dated Jan. 24, 2019 of corresponding German application No. 102018207733.9; 33 pages.

*Primary Examiner* — Tung X Nguyen
(74) *Attorney, Agent, or Firm* — Maier & Maier, PLLC

(57) ABSTRACT

A battery cell for a vehicle battery. A cell housing which encloses electrochemical substances of a galvanic cell arrangement in a hermetically sealed manner, and an acquisition device in the cell housing, which acquires status data of the battery cell in the cell housing, and/or a control device which switches at least one switching element in the cell housing as a function of control data. A wall of the cell housing has a window region in which a window material is arranged, which has a predetermined attenuation value for a predetermined radiation spectrum, and a communication device arranged in the cell housing is configured to transmit the status data from the window region out of the cell housing.

19 Claims, 6 Drawing Sheets

(56) References Cited

U.S. PATENT DOCUMENTS

2013/0002260 A1\* 1/2013 Golubkov ......... H01M 10/4264
   324/426
2019/0222032 A1\* 7/2019 Bruch ................... H02J 7/0013

\* cited by examiner

BATTERY CELL FOR A VEHICLE BATTERY, AND VEHICLE BATTERY AND MOTOR VEHICLE

FIELD

The invention relates to a battery cell for a vehicle battery. In the battery cell, the electrochemical substances, by means of which a galvanic cell arrangement is implemented, are arranged in a cell housing. Moreover, in the cell housing, an acquisition device for acquiring status data of the battery cell is arranged.

BACKGROUND

Such a battery cell is known, for example, from DE 10 2013 106 740 A1. From this prior art it is known that the acquired status data can be provided by means of a cable through a duct in the cell housing of the battery cell to an evaluation device outside of the housing.

However, the battery cell housing must be hermetically sealed, so that the electrochemical substances do not interact with the surroundings, for example, by taking in water vapor. A duct therefore always entails the risk that, at this site, leakage occurs, for example, due to fluidity of an insulation material and/or due to material fatigue caused by vibrations as are always present in the operation of a motor vehicle. As an alternative, it is known from the prior art to arrange the acquisition device outside of the cell housing and to check the electrochemical substances only visually through a transparent pane. As a result, the cell housing can indeed remain hermetically sealed, but the measurement is limited to the possibilities resulting from the visual check.

From DE 10 2009 048 236 A1 and EP 2 328 207 A1, it is known that a window region can be provided in a cell housing of a battery cell, in which a so-called rupture disk is arranged, which represents a predetermined breaking point for the case in which the internal pressure in the cell housing rises above a threshold value. The rupture disk then breaks, and the excess pressure can escape into the surroundings of the battery cell. The rupture disk can be produced from a material other than a wall of the cell housing.

SUMMARY

The underlying aim of the invention is to enable an acquisition of status data and/or a conversion of control data for a battery cell.

The aim is achieved by the subject matters of the independent claims. Advantageous embodiments of the invention result from the dependent claims, the following description and the figures.

By means of the invention, a battery cell for a vehicle battery is provided. The battery cell is designed in particular as a rechargeable battery cell, that is to say as a so-called electrical accumulator. In a manner which is known per se, the battery cell has a cell housing which encloses electrochemical substances of a galvanic cell arrangement in a hermetically sealed manner. The electrochemical substances can comprise, for example, electrode material and/or an electrolyte and/or a battery fluid. The cell housing encloses these electrochemical substances, that is to say the electrochemical substances are contained or enclosed by the cell housing or filled in the cell housing. The cell housing thus delimits the chemical reaction space proper from the surroundings. At least one of the electrochemical substances is thus in contact with the inner side of the cell housing. The galvanic cell arrangement is designed in particular as a lithium ion cell.

In the cell housing, an acquisition device is also arranged in the described manner. The acquisition device is configured to acquire status data of the battery cell in the cell housing. The acquisition device can be configured, for example, to acquire a temperature and/or an electrical voltage and/or a switching state of at least one switching element arranged in the cell housing. In addition or alternatively to the acquisition device, a control device is arranged in the cell housing. The control device is configured to switch the at least one switching element in the cell housing as a function of control data. In a switching state, the at least one switching element can be provided, for example, in order to electrically bypass and/or to discharge the galvanic cell arrangement via an electrical resistance. By means of the control device, the acquisition device can also be configured or controlled as a function of control data.

Then, in order to be able to provide the acquired status data outside the battery cell and/or to receive the control data from outside the battery cell, it is provided according to the invention that a region of the cell housing, here referred to as window region, is made of a material, here referred to as window material. In other words, a wall of the cell housing comprises a window region in which the window material is arranged. The window material has a predetermined attenuation value for a predetermined radiation spectrum. Thus, in the window region, the hermetic sealing of the cell housing is achieved by means of the window material. The window material here has the additional property of having a certain attenuation value for the predetermined radiation spectrum. The attenuation value here is preferably particularly low. Preferably, the window material is transparent to the radiation spectrum. However, since this cannot always be implemented to such a perfect extent, it is preferable to provide that, as a result of the attenuation value of the window material, the attenuation in the radiation spectrum is less than 50 percent, in particular less than 40 percent. Thus, the radiation can come out of the cell housing through the window material. Here, the radiation intensity is attenuated or decreased by at most 50 percent, preferably at most 40 percent.

In addition to the acquisition device, a communication device is also arranged in the cell housing. The communication device is configured to transmit the status data from the window region out of the cell housing and/or to receive the control data via the window region from outside the cell housing by wireless transmission in the radiation spectrum. Thus, the low attenuation of the window material in the window region is used in order to transmit status data through the window region or from the window region out of the cell housing and/or to transmit the control data into the cell housing. For the transmission, a radiation which is in the radiation spectrum is thus used, so that the attenuation value of the window material is effective. The window material is preferably an electrically insulating material, for example, a polymer.

By means of the invention, the advantage is achieved that, for the transmission of the status data and/or for the reception of the control data, a cable does not have to be led through a duct of the cell housing. Nevertheless, the acquisition device for the acquisition of the status data can be arranged within the cell housing. The transmission of the status data occurs wirelessly based on a radiation in the radiation spectrum. Since no duct for a cable in the wall of the cell housing is necessary, this solution is also particularly vibration-resistant and it can also not occur that an insulation material impairs the hermetic seal due to flow. The acquisition device and/or the communication device and/or the control device for the at least one switching element can be implemented, for example, on the basis of an electronic circuit, for example, an ASIC (Application Specific Integrated Circuit). An electronic circuit for the acquisition device and/or communication device and/or control device can be embedded in the cell housing, for example, in the electrochemical substances. An energy supply for the electronic circuit can be provided, for example, on the basis of the galvanic cell arrangement in the cell housing itself.

The invention also comprises embodiments resulting in additional advantages.

Several embodiments relate to the aspect by means of which radiation the status data can be transmitted and/or the control data can be received.

An embodiment provides that the window region is designed as slot antenna and the window material arranged in the window region is an electrically insulating dielectric. "Electrically insulating" is understood to mean in particular an electrical conductivity of less than 1 siemens, in particular less than 0.1 siemens. The communication device is configured to transmit at least some of the status data as electromagnetic radio signal by means of the slot antenna by generating an A.C. voltage between two electrically conductive margins of the window region. At least some of the status data is thus transmitted by radio, wherein the transmission antenna used for this purpose represents the slot antenna which is formed by the window region itself. At least a portion of the control data can also be received as electromagnetic radio signal by means of the slot antenna. The radio signal here generates said A.C. voltage which can be acquired by the communication device. This results in the advantage that no additional component for an antenna is necessary.

An embodiment provides that the radiation spectrum comprises at least a portion of the visible light spectrum (visible light spectrum: 400 nanometers to 700 nanometers) and/or at least a portion of the infrared spectrum. The window material is preferably optically transparent to this portion; however, an attenuation value at least occurs as already described. The communication device is configured to radiate at least some of the status data as a modulated light signal in the respective portion of the visible light spectrum and/or of the infrared spectrum by means of a controllable light source. In other words, at least some of the status data is transmitted by means of visible light and/or infrared light. At least a portion of the control data can also be received as a modulated light signal by means of an optoelectronic converter, for example, a photodiode. This results in the advantage that the transmission can occur in a directed manner.

An embodiment provides that the communication device comprises an electric coil and is configured to adjust or modulate a coil current of the coil as a function of at least some of the status data. The coil is here configured to generate by means of the coil current an alternating magnetic field which the coil radiates through the window region out of the cell housing. In other words, this portion of the status data is thus transmitted on the basis of an NFC (Near Field Communication) out of the cell housing. At least a portion of the control data can also be received as alternating magnetic field by induction by means of the coil. This results in the advantage that indifference or mutual interference of several battery cells due to the small range is unlikely or reduced.

An embodiment provides that the communication device is configured to receive the energy used for said coil current by induction from the coil itself and/or from an additional induction coil from outside the cell housing. In other words, the RFID technology (RFID—Radio-Frequency Identification) is used here. This results in the advantage that the communication device can be operated separately and/or independently of the electrical circuit of the galvanic cell arrangement. This can be advantageous, for example, if the galvanic cell arrangement is short circuited (for example, for a targeted permanent discharging and/or due to damage) and/or if a triggered breaker (for example a fuse) blocks a current flow in the galvanic cell arrangement. Nevertheless, independently of the status of the galvanic cell arrangement, it is possible to exchange status data and/or control data with the communication device. The communication device and/or the acquisition device and/or the control device can have, for example, a digital memory element (for example, a flash memory or an EPROM—erasable programmable read-only memory) or a shared memory element can be provided. Then, a memory content of such a memory element can be read out by means of the NFC communication and/or RFID technology. This is possible even in the case in which current flow is no longer possible in the galvanic cell arrangement itself. By means of the described induction, an "external starting aid" can thus be provided for the operation of the communication device.

An embodiment provides that the communication device has a radio antenna arranged in the cell housing and is configured to transmit at least some of the status data by means of a radio signal through the window region. At least a portion of the control data can also be received by means of the radio antenna. This results in the advantage that the window material of the cell housing can be optically closed, that is to say it can be black, for example.

An embodiment provides here that the communication device is designed as a Bluetooth radio module and/or a NFC radio module and/or a WLAN radio module (WLAN—Wireless Local Area Network). This results in the advantage that an electronic component available as mass-produced product can be used for the communication device. In addition, energy-saving variants for Bluetooth and NFC and WLAN exist.

So far, it has been described that the status data is transmitted via the window region and/or the control data is received via the window region and, for that purpose, the window material is provided in the window region. Here, it can be provided that a wall of the cell housing is made entirely of the window material, for example, of a polymer which is transparent to radio waves and/or magnetic waves. Then, the communication device can transmit as desired out of the cell housing. The window region can then be secured as desired. It can also be provided that the wall of the cell housing outside of the window region has a different attenuation value which is greater than the attenuation value of the window material.

In this context, an embodiment provides that the wall of the cell housing comprises a wall material which has an attenuation value for the radiation spectrum, which is greater than the attenuation value of the window material. In other words, the radiation spectrum, outside of the window region, can only be radiated or irradiated through the wall material present there with a greater attenuation than in the window region where the window material is provided. In the wall material, the window region is then designed as a recess or passage opening. In other words, in the wall of the cell housing, the window region is produced in that wall material is left open there and instead the window material is inserted or arranged. This results in the advantage that, outside of the window region, the wall of the cell housing can be designed with a desired wall material.

An embodiment provides that the wall of the cell housing comprises a metal and/or a metal alloy as wall material. Thus, for example, aluminum and/or steel can be provided as wall material. This results in the advantage that waste heat dissipation from the cell housing into the surroundings thereof is promoted or provided.

An embodiment provides that the window material for the window region is designed as a pane which, in an edge region of the wall material adjoining the window region, engages behind the wall material in the cell housing. In other words, the pane has a collar or an edge region, or the pane is arranged far enough in the housing interior so that a margin of the pane lies on the wall material on the inner side of the wall. This results in the advantage that, in the case of an excess pressure in the cell housing, the pane is pressed against the wall material. This results in a self-sealing arrangement.

An embodiment provides that the window material is designed as a rupture disk which, at a predetermined internal pressure of the cell housing, breaks even before the wall material breaks. In other words, the window region is used for two functions, namely, on the one hand, for the transmission of the status data, and, on the other hand, as a rupture disk. Thus a recess in the wall material, as is necessary for the rupture disk, is at the same time used for the transmission of the status data.

An embodiment provides that the window region is provided in a cover plate of the cell housing. This simplifies the assembly.

As already explained, the window material in the window region is preferably transparent to the radiation spectrum used for the transmission of the status data. However, here it is preferably provided that the window material is non-transparent or opaque to UV light. This results in the advantage that an electrochemical substance in the cell housing is protected from UV light.

Another aspect of the invention relates to a vehicle battery for a motor vehicle. The vehicle battery represents an electrical accumulator for the motor vehicle. In other words, the vehicle battery is rechargeable. For this purpose, the vehicle battery comprises at least one battery cell according to an embodiment of the invention.

An embodiment provides that, on the respective window region of the at least one battery cell, in each a communication device outside the cell for a wireless transmission is arranged for receiving respective status data from the respective battery cell and/or for transmitting respective control data into the respective battery cell in each case. A communication device outside the cell is thus arranged outside on or in front of the window region of the respective battery cell. In that the transmission occurs in a wireless manner, that is to say, the status data is transmitted in a wireless manner out of the battery cell to the communication device outside the cell, and/or the control data is transmitted into the cell housing, this transmission can occur in a galvanically separated manner. The vehicle battery can thus also be designed as a so-called high-voltage battery with a rated voltage greater than 60 volt D.C. voltage. Nevertheless, the communication device outside the cell can be operated with an operating voltage of less than 60 volts, in particular less than 20 volts, galvanically separated from the high voltage.

An embodiment provides that multiple battery cells and thus multiple communication devices outside the cell are provided, and the communication devices outside the cell are arranged on a common flexible conduction band. In other words, when the communication devices outside the cell are arranged at the respective window region of the respective battery cell, the conduction band is installed in one work step, and then the communication devices outside the cell can be oriented individually. This simplifies the assembly of the vehicle battery during the manufacture thereof.

Finally, the invention also relates to a motor vehicle which comprises an embodiment of the vehicle battery according to the invention. The motor vehicle according to the invention is preferably designed as a car, in particular as a passenger car or a truck.

The invention also comprises the combinations of the features of the described embodiments.

BRIEF DESCRIPTION OF THE DRAWING

Below, embodiment examples of the invention are described. For this purpose, the figures show.

DETAILED DESCRIPTION

Figure 1:
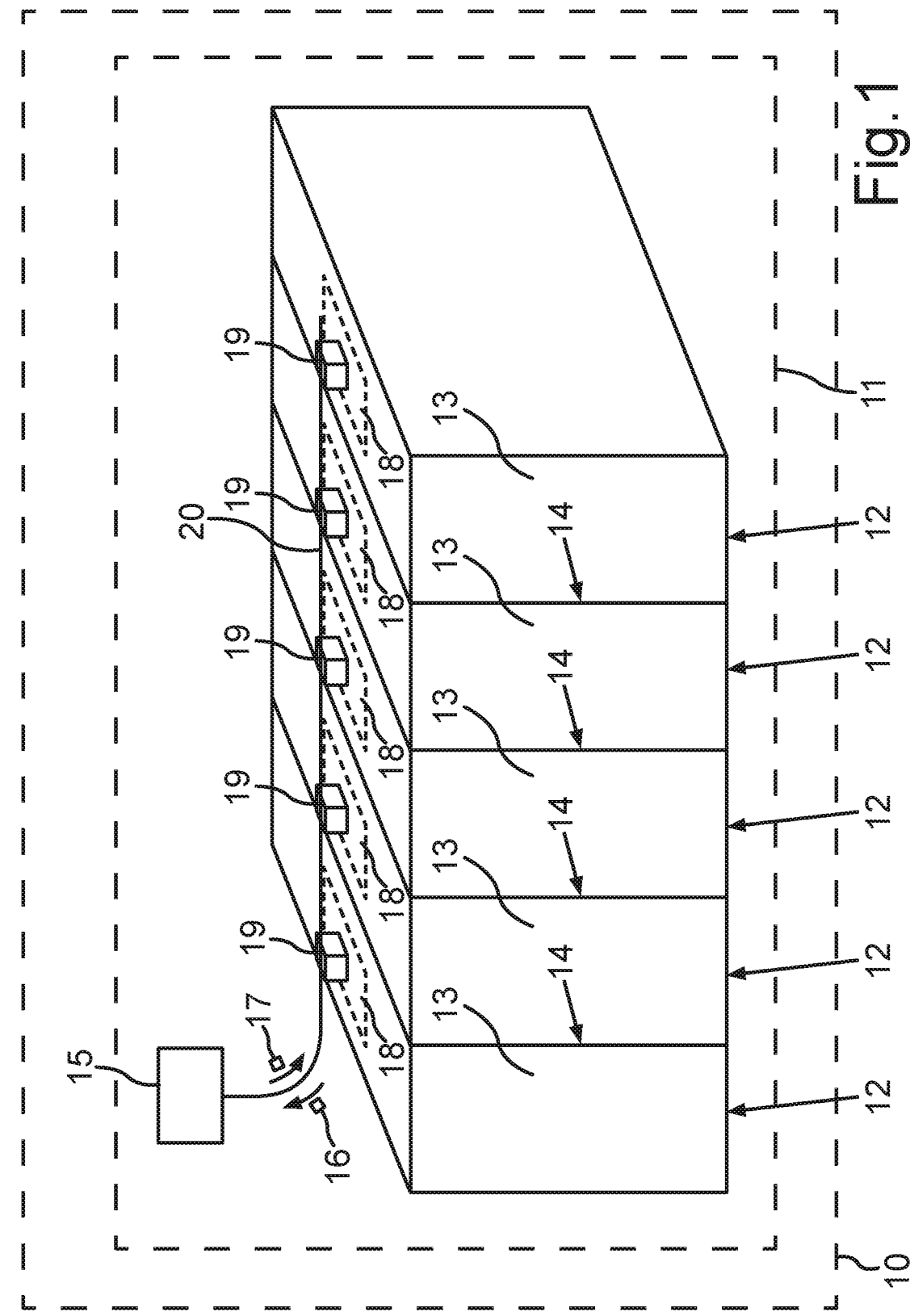
FIG. 1 a diagrammatic representation of an embodiment of the motor vehicle according to the invention with a vehicle battery.

The embodiment examples explained below are preferred embodiments of the invention. In the embodiment examples, the described components of the embodiments in each case represent individual features of the invention, to be considered independently of one another, which in each case develop the invention independently of one another and thus should also be considered as part of the invention individually or in combinations other than the combination shown. Moreover, the described embodiments can also be completed by others of the already-described features of the invention.

In the figures, identical reference numerals in each case represent functionally equivalent elements.

FIG. 1 shows a motor vehicle 10 which is a motor car, in particular a passenger car or a truck. In the motor vehicle 10, a vehicle battery 11 can be provided, which can be a high-voltage battery, for example. In order to generate a battery voltage to be provided by the vehicle battery 11, battery cells 12 can be provided in the vehicle battery 11, several of which are represented in FIG. 1 as examples. In FIG. 1, for the sake of simplicity, voltage taps for tapping the respective cell voltage of the battery cells 12 are not represented. The battery cells 12 in each case can comprise a cell housing 13, in which in each case electrochemical substances for a galvanic cell arrangement can be arranged. The battery cells 12 can be lithium ion cells, for example. Between the individual battery cells 12, an electrical insulation 14 can be provided in each case, in order to separate electrical potentials of the battery cells 12 from one another.

In the vehicle battery 11, it is provided that each individual battery cell 12 is monitored for its current status and/or a control device is provided in each battery cell 12 for switching the respective battery cell 12 individually. For this purpose, a monitoring device 15 can be provided in the vehicle battery 11. The monitoring device 15 can be implemented, for example, on the basis of a microcontroller and/or of a microprocessor. The monitoring device 15 can receive in each case status data 16 from the individual battery cells 12, data which describes a respective internal operating status of the respective battery cell 12. The monitoring device 15 can transmit control data 17, by means of which each of the battery cells 12 can be switched in each case individually.

The status data 16 and the control data 17 can be exchanged in a wireless manner with the respective battery cell 12 via a window region 18 of the respective battery cell 12. For this purpose, at the respective window region 18, a respective communication outside the cell device 19 can be arranged in the vehicle battery 11. The communication devices 19 for each battery cell 12 can be switched or coupled overall via a flexible conduction band 20 with the monitoring device 15. The communication devices 19 can thus be installed in a line over the battery cells 12. The communication devices 19 can be arranged, for example, at the respective window region 18, for example, they can be fastened or glued there.

Figure 2:
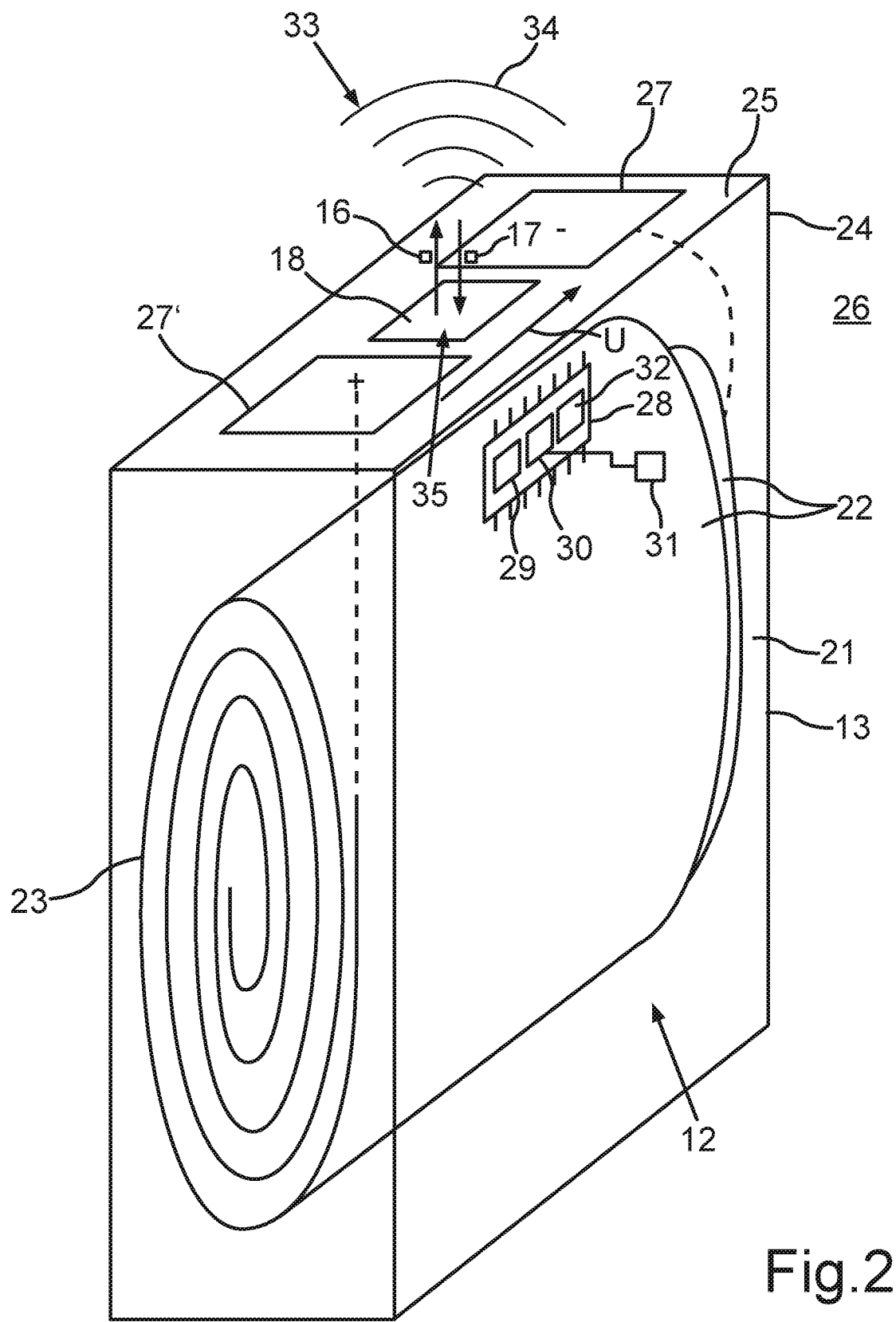
FIG. 2 a diagrammatic representation of an embodiment of the battery cell according to the invention, as it can be provided in the vehicle battery of FIG. 1.

FIG. 2 illustrates the interior of an individual battery cell 12. By means of the cell housing 13, a chemical reaction space 21 can be delimited, in which electrochemical substances 22 can be located. As electrochemical substances 22, electrodes 23 and an electrolytic fluid, for example, can be provided. The electrodes 23 are represented in FIG. 2 as a so-called jelly roll form.

The cell housing 13 can be manufactured, for example, from aluminum or steel. For example, by deep drawing, a shell 24 can be provided, which can be hermetically closed by a cover plate 25. Thus, the electrochemical substances 22 in the chemical reaction space 21 are separated hermetically from a surroundings 26 of the battery cell 12. In FIG. 2, a negative electrical connection contact 27 and a positive electrical connection contact 27' are represented, between which said battery voltage U is generated by means of the galvanic cell arrangement of the electrochemical substances 22. Within the cell housing 13, in addition to the electrochemical substances 22, an electronic circuit 28 can be arranged. By means of the electronic circuit 28, it is possible to provide an acquisition device 29 for acquiring or generating said status data 16, a control device 30 for switching at least one switching element 31 in the cell housing 13, and/or a communication device 32. The control device 30 can switch at least one switching element 31 as a function of the control data 17. A switching element 31 can be implemented, for example, on the basis of at least one transistor. The status data 16 can be generated by the acquisition device 29, for example, on the basis of a temperature measurement and/or a voltage measurement.

In order to transmit the status data 16 through the window region 18 out of the cell housing 13 into the surroundings 26 and/or in order to receive the control data 17 from the surroundings 26 in the cell housing 13, the communication device 32 provides said wireless transmission 33 which can occur on the basis of a radio signal and/or light signal and/or magnetic signal. Thus, in general, a radiation 34 is provided wherein a window material 35 in the window region 18 is transparent to the radiation spectrum of this radiation or at least brings about an attenuation that is less than a predetermined height value. In other words, the attenuation value of the window material 35 is selected in such a manner that the radiation 34 can penetrate through the wall of the cell housing 13 in the window region 18.

Figure 3:
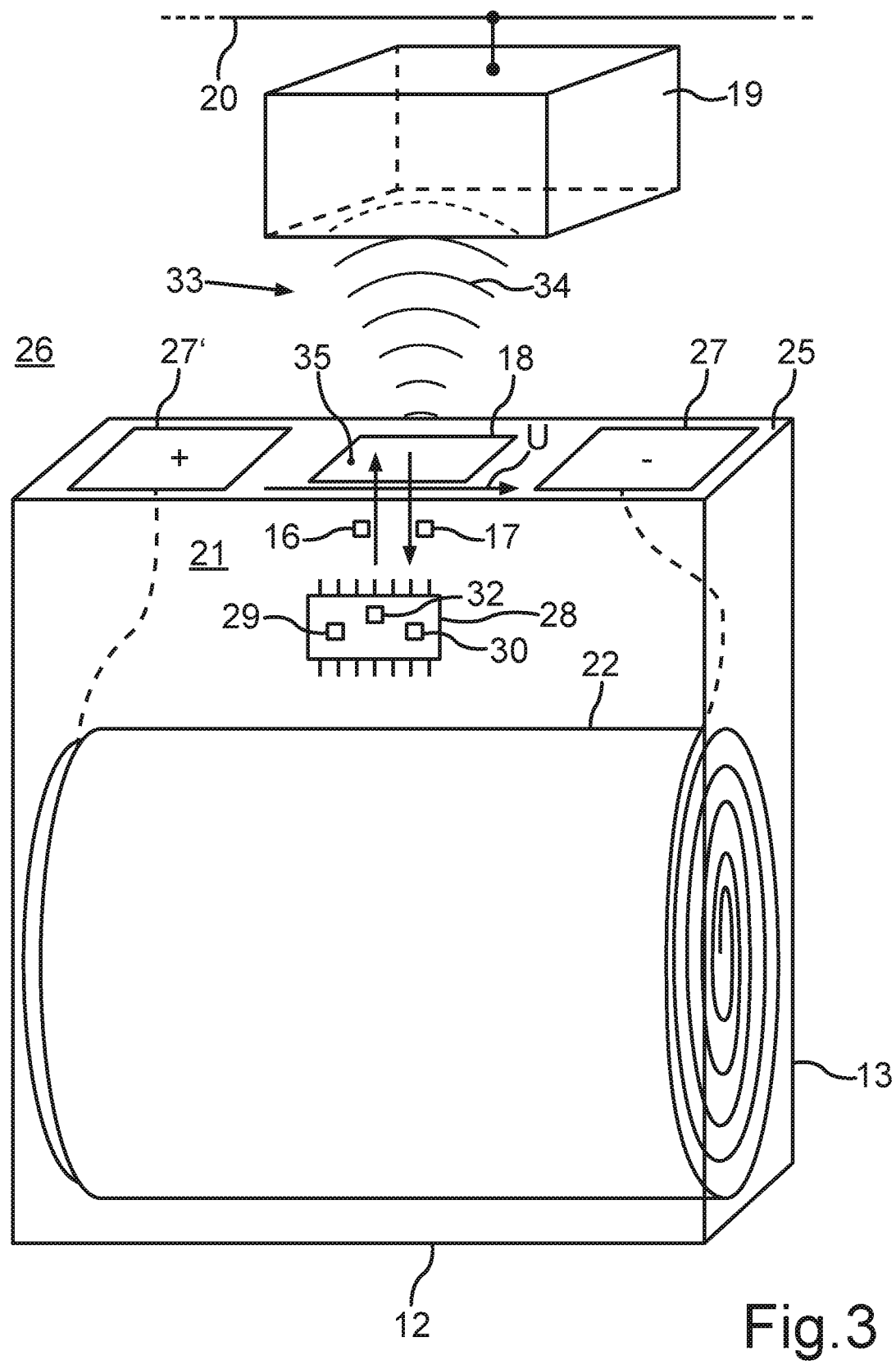
FIG. 3 a diagrammatic representation of the battery cell of FIG. 1 from another perspective.

FIG. 3 illustrates how the wireless transmission 33 can occur thereby by means of the radiation 34 between the communication device 32 in the cell housing 13 and communication device 19 outside the cell in a galvanically separated manner, so that the battery voltage U is separated from each communication device 19.

The window region 18 can be arranged, for example, in the cover plate 25. However, it is also possible to provide the window region 18 at any other suitable site of the cell housing 13.

Figure 4:
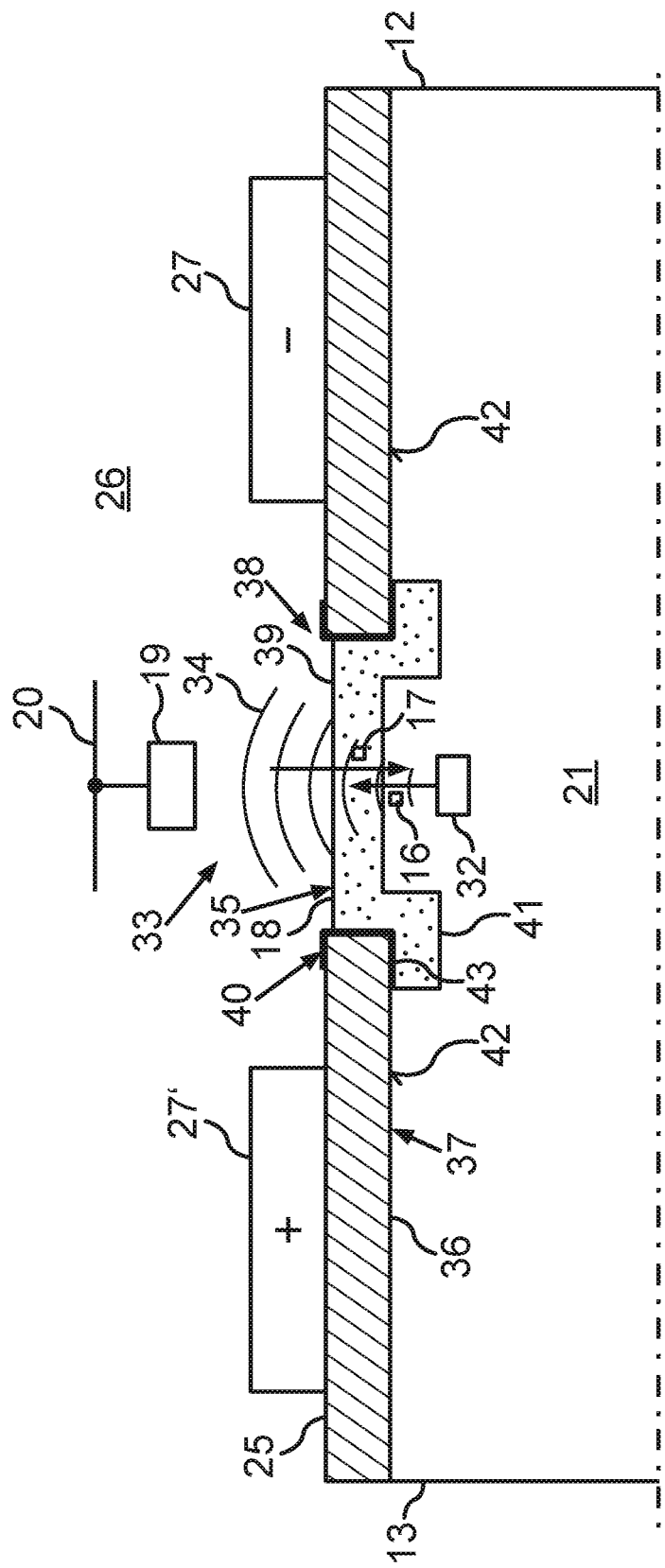
FIG. 4 a diagrammatic representation of a longitudinal section of the battery cell to illustrate data transmission.

FIG. 4 illustrates how the cell housing 13 can include different materials. FIG. 4 illustrates for this purpose in a longitudinal section the cover plate 25 as an example. In general, it can be provided that a wall 36 of the cell housing 13 is formed from a wall material 37 which can comprise, for example, a metal and/or a metal alloy. For example, as wall material 37, aluminum or steel can be provided. The window region 18 can be designed as a recess 38 in the wall material 37. In other words, a passage opening is provided as a recess 38 in the wall material 37. In the window region 18, instead of the wall material 37, the window material 35 is provided. The wall material 37 can be closed or opaque to the radiation 34 which is used for the wireless transmission 33. The window region 18 is arranged between the communication device 32 in the battery cell 12 and the communication device 19 outside the cell, so that the radiation 34 can be exchanged between the two communication devices 19, 32. The window material 35 can be designed as a pane 39 which, in an edge region 40 of the wall material 37, engages, for example, by means of a collar 41, behind the wall material 37, that is to say, viewed from outside, on the other side of the window region 18 it also in addition has an overhang or a collar 41 which, on the inner side 42 of the cell housing 13, adjoins the wall material 37. It can be provided that here, between the wall material 37 and the collar 41, a sealing device 43 is arranged, for example, a sealing material, for example, a silicone or an adhesive or a rubber. If, in the reaction space 21 inside the cell, a pressure is greater than in the surroundings 26, then the pane 39 is pressed by means of the collar 41 thereof against the wall material 37, whereby a hermetic sealing of the cell housing 13 in the window region 18 can be ensured.

Figure 5:
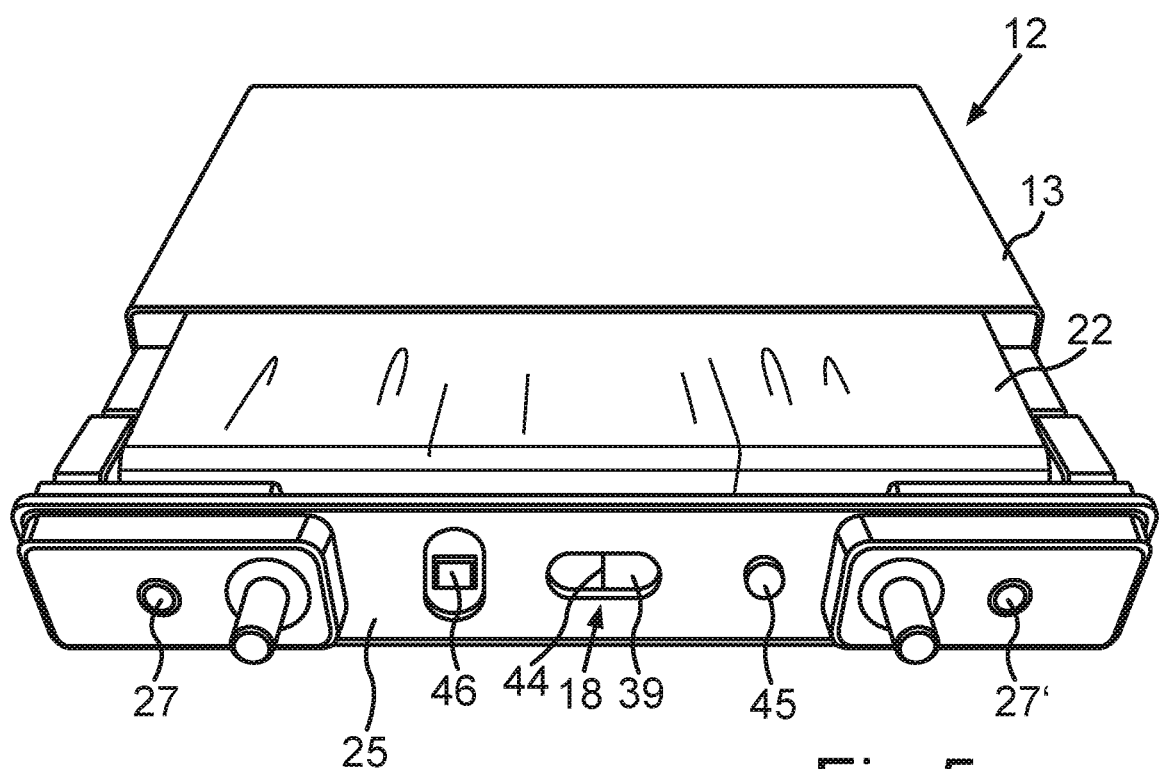
FIG. 5 an exploded representation of the battery cell.

FIG. 5 illustrates how the window region 18 can be implemented at the same time by means of a rupture disk which can be provided as the pane 39. The rupture disk can have a predetermined breaking point 44, whereby the rupture disk breaks in the case of an excess pressure in the reaction space 21 inside the cell if the excess pressure is greater than a threshold value. In FIG. 5, a filling valve 45 is represented moreover, through which the battery cell 12 can be filled with an electrolytic fluid which can be filled in the cell housing 13. Moreover, a cell marking 46 can be provided, which individually marks the battery cell 12. The cell marking 46 can be implemented on the basis of a QR code.

Figure 6:
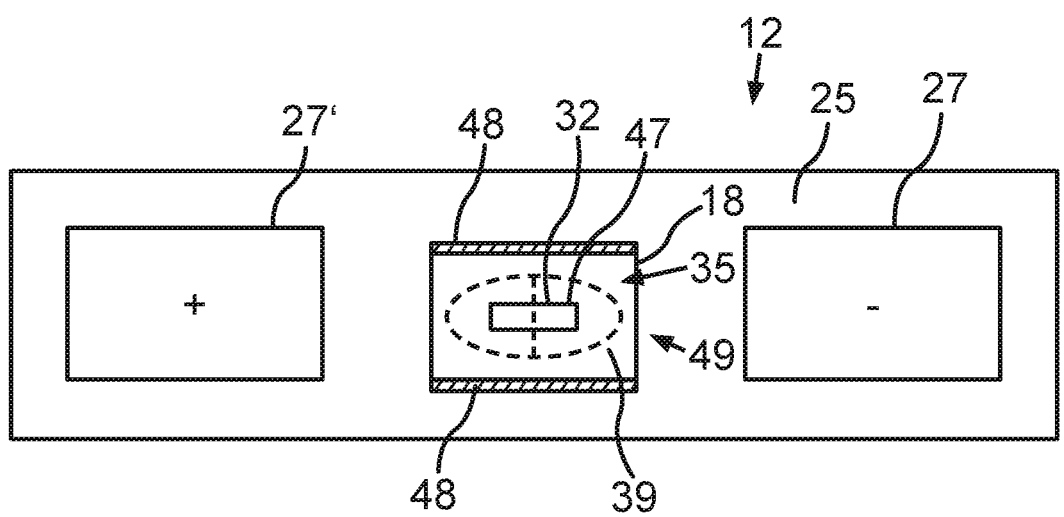
FIG. 6 a diagrammatic representation of a top view onto the battery cell.

FIG. 6 again illustrates the battery cell 12 from the standpoint of the communication device 19 outside the cell. Through the window material 35 of the window region 18, the communication device 32, or at least a radiation source 47 in the radiation spectrum of the radiation 34, can be recognized. The radiation source 47 for the radiation 34 can be, for example, a light source and/or a magnetic source such as, for example, an electric coil, and/or a radio source. In addition or alternatively, it can be provided that, at two electrically conductive margins 48, an electrical A.C. voltage can be applied by communication device 32, whereby the window region 18 can act as a slot radiator or slot antenna 49.

By means of the window region 18, a wireless transmission 33 can thus be enabled on the basis of a radio transmission (for example, by means of slot radiators) and/or optically (based on the optical waveguide principle) and/or magnetically (for example, by means of magnetic coupling coils), in order to exchange the status data 16 and/or control data 17 between the communication devices 32 and 19. At the same time, the pane 39 used in the window region 18 can function as rupture disk and/or as inspection window. A radio shielding or faraday shielding say of the rest of the cell housing 13 by a wall material 37 does not influence the transmission.

The window material 35 can be designed to be optically dense and/or closed to UV radiation in order to protect the electrochemical substances 22 from UV radiation.

In order to ensure the hermetic sealing of the cell housing 13 even in the case of vibrations, the collar 41 can be provided in the described manner, for example, resulting in a self-sealing effect in case of an internal pressure in the reaction space 21 inside the cell. In addition, by means of a sealing device 43, an elastic seal can be provided.

Overall, the examples, show how by means of the invention an inspection window for a wireless transmission of status data out of a battery cell can be provided.

The invention claimed is:

1. A battery cell for a vehicle battery, comprising:
   a cell housing which encloses electrochemical substances of a galvanic cell arrangement in a hermetically sealed manner, and
   an acquisition device arranged in the cell housing, which is configured to acquire status data of the battery cell in the cell housing, and/or a control device which is configured to switch at least one switching element in the cell housing as a function of control data, wherein a wall of the cell housing has a window region in which a window material is arranged, which has a predetermined attenuation value for a predetermined radiation spectrum, and a communication device arranged in the cell housing is configured to transmit the status data from the window region out of the cell hosing by a wireless transmission in the radiation spectrum and/or to receive the control data via the window region from outside the cell housing,
   wherein the window region is designed as slot antenna, and the window material arranged in the window region is an electrically insulating dielectric, and the communication device is configured to transmit at least a portion of the status data as an electromagnetic radio signal by the slot antenna by generating an A.C. voltage between two electrically conductive margins of the window region and/or to receive at least a portion of the control data by acquiring an A.C. voltage at the margins.

2. The battery cell according to claim 1, wherein the window material is designed as a pane which, in an edge region of the wall material adjoining the window region, engages behind said wall material in the cell housing.

3. The battery cell according to claim 1, wherein the window material is designed as a rupture disk which breaks at a predetermined internal pressure of the cell housing even before the wall material breaks.

4. A vehicle battery with at least one battery cell according to claim 1.

5. The vehicle battery according to claim 4, wherein, at a respective window region of the at least one battery cell, in each case a communication device outside the cell for a wireless transmission is arranged for receiving respective status data from the respective battery cell and/or for transmitting respective control data into the respective battery cell.

6. The vehicle battery according to claim 4, wherein multiple battery cells and thus multiple communication devices outside the cell are provided, and the communication devices outside the cell are arranged on a common flexible conduction band.

7. A battery cell for a vehicle battery, comprising:
   a cell housing which encloses electrochemical substances of a galvanic cell arrangement in a hermetically sealed manner, and
   an acquisition device arranged in the cell housing, which is configured to acquire status data of the battery cell in the cell housing, and/or a control device which is configured to switch at least one switching element in the cell housing as a function of control data, wherein a wall of the cell housing has a window region in which a window material is arranged, which has a predetermined attenuation value for a predetermined radiation spectrum, and a communication device arranged in the cell housing is configured to transmit the status data from the window region out of the cell hosing by a wireless transmission in the radiation spectrum and/or to receive the control data via the window region from outside the cell housing,
   wherein the communication device has an electric coil and is configured to modulate a coil current of the coil as a function of at least some of the status data, and wherein the coil is configured to generate by the coil current an alternating magnetic field which the coil radiates through the window region out of the cell housing and/or to receive at least a portion of the control data as an alternating magnetic field by induction,
   wherein the communication device is configured to receive electrical energy used for the coil current by induction from the coil and/or from an additional induction coil from outside the cell housing.

8. The battery cell according to claim 7, wherein the window material is designed as a pane which, in an edge region of the wall material adjoining the window region, engages behind said wall material in the cell housing.

9. The battery cell according to claim 7, wherein the window material is designed as a rupture disk which breaks at a predetermined internal pressure of the cell housing even before the wall material breaks.

10. A vehicle battery with at least one battery cell according to claim 7.

11. The vehicle battery according to claim 10, wherein, at a respective window region of the at least one battery cell, in each case a communication device outside the cell for a wireless transmission is arranged for receiving respective status data from the respective battery cell and/or for transmitting respective control data into the respective battery cell.

12. The vehicle battery according to claim 10, wherein multiple battery cells and thus multiple communication devices outside the cell are provided, and the communication devices outside the cell are arranged on a common flexible conduction band.

13. A battery cell for a vehicle battery, comprising:
a cell housing which encloses electrochemical substances of a galvanic cell arrangement in a hermetically sealed manner, and
an acquisition device arranged in the cell housing, which is configured to acquire status data of the battery cell in the cell housing, and/or a control device which is configured to switch at least one switching element in the cell housing as a function of control data, wherein a wall of the cell housing has a window region in which a window material is arranged, which has a predetermined attenuation value for a predetermined radiation spectrum, and a communication device arranged in the cell housing is configured to transmit the status data from the window region out of the cell hosing by a wireless transmission in the radiation spectrum and/or to receive the control data via the window region from outside the cell housing,
wherein the communication device has a radio antenna arranged in the cell housing and is configured to transmit at least a portion of the status data by a radio signal through the window region and/or to receive at least a portion of the control data by a radio signal through the window region,
wherein the communication device is designed as a Bluetooth radio module and/or an NFC radio module and/or a WLAN radio module.

14. The battery cell according to claim 13, wherein the wall of the cell housing has a wall material which has an attenuation value for the radiation spectrum which is greater than the attenuation value of the window material, and the window region is designed as a recess in the wall material.

15. The battery cell according to claim 13, wherein the wall of the cell housing includes a metal and/or a metal alloy as wall material.

16. The battery cell according to claim 13, wherein the window material is designed as a pane which, in an edge region of the wall material adjoining the window region, engages behind said wall material in the cell housing.

17. The battery cell according to claim 13, wherein the window material is designed as a rupture disk which breaks at a predetermined internal pressure of the cell housing even before the wall material breaks.

18. A vehicle battery with at least one battery cell according to claim 13.

19. The vehicle battery according to claim 18, wherein, at a respective window region of the at least one battery cell, in each case a communication device outside the cell for a wireless transmission is arranged for receiving respective status data from the respective battery cell and/or for transmitting respective control data into the respective battery cell.

* * * * *